United States Patent
Yang et al.

(10) Patent No.: US 10,395,733 B2
(45) Date of Patent: Aug. 27, 2019

(54) FORMING STRUCTURE AND METHOD FOR INTEGRATED CIRCUIT MEMORY

(71) Applicant: MACRONIX INTERNATIONAL CO., LTD., Hsinchu (TW)

(72) Inventors: Shang-Chi Yang, Changhua (TW); Chun-Hsiung Hung, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 15/850,188

(22) Filed: Dec. 21, 2017

(65) Prior Publication Data

US 2019/0198103 A1 Jun. 27, 2019

(51) Int. Cl.
*G11C 13/00* (2006.01)
*H01L 45/00* (2006.01)
*H01L 27/24* (2006.01)

(52) U.S. Cl.
CPC ........ *G11C 13/0038* (2013.01); *G11C 13/003* (2013.01); *G11C 13/0004* (2013.01); *G11C 13/004* (2013.01); *H01L 27/2427* (2013.01); *H01L 27/2436* (2013.01); *H01L 27/2481* (2013.01); *H01L 45/06* (2013.01); *G11C 13/0023* (2013.01); *G11C 2213/30* (2013.01); *G11C 2213/71* (2013.01); *H01L 45/1253* (2013.01); *H01L 45/141* (2013.01)

(58) Field of Classification Search
CPC ................... G11C 13/0038; G11C 13/003
See application file for complete search history.

(56) References Cited

U.S. PATENT DOCUMENTS

| | | | |
|---|---|---|---|
| 6,579,760 B1 | 6/2003 | Lung | |
| 7,593,202 B2 | 9/2009 | Khazhinsky et al. | |
| 2004/0196693 A1* | 10/2004 | Iwata | G11C 11/16 365/158 |
| 2006/0126380 A1* | 6/2006 | Osada | G11C 11/5678 365/163 |

(Continued)

FOREIGN PATENT DOCUMENTS

WO 2017111930 A1 6/2017

OTHER PUBLICATIONS

EP Search Report from Application No. 17210182.6 dated Jun. 14, 2018, 8 pages.

*Primary Examiner* — Hoai V Ho
*Assistant Examiner* — Jay W. Radke
(74) *Attorney, Agent, or Firm* — Haynes Beffel & Wolfeld LLP

(57) ABSTRACT

An integrated circuit and its manufacturing method are disclosed. The integrated circuit includes a forming voltage pad, a memory array including a plurality of memory cells, and a plurality of access lines connected to the memory cells. A forming voltage rail is coupled to the forming voltage pad. A diode is disposed in current flow communication with the forming voltage rail and an access line in the plurality of access lines. The diode is configured to be forward biased during application of a forming voltage to the forming voltage pad to induce a forming current in memory cells in the plurality of memory cells, and to be reverse biased during application of a reference voltage to the forming voltage pad during utilization of the memory array for memory operations.

21 Claims, 10 Drawing Sheets

(56) References Cited

U.S. PATENT DOCUMENTS

| | | | |
|---|---|---|---|
| 2007/0014184 A1* | 1/2007 | Lee | G11C 8/08 |
| | | | 365/230.06 |
| 2008/0101109 A1 | 5/2008 | Haring-Bolivar et al. | |
| 2009/0272962 A1* | 11/2009 | Kumar | H01L 45/08 |
| | | | 257/4 |
| 2009/0310402 A1* | 12/2009 | Parkinson | G11C 13/0004 |
| | | | 365/163 |
| 2010/0165719 A1 | 7/2010 | Pellizzer | |
| 2010/0232209 A1 | 9/2010 | Kawabata et al. | |
| 2012/0307547 A1 | 12/2012 | Park et al. | |
| 2013/0051124 A1 | 2/2013 | Oh et al. | |
| 2013/0058154 A1* | 3/2013 | Katagiri | G11C 8/10 |
| | | | 365/148 |
| 2013/0077380 A1* | 3/2013 | Sakamoto | G11C 13/0007 |
| | | | 365/148 |
| 2013/0322164 A1 | 12/2013 | Lym et al. | |
| 2015/0144860 A1 | 5/2015 | Lin et al. | |
| 2016/0133836 A1* | 5/2016 | Lan | H01L 45/16 |
| | | | 365/51 |

\* cited by examiner

FORMING STRUCTURE AND METHOD FOR INTEGRATED CIRCUIT MEMORY

BACKGROUND

Field

The present technology relates to integrated circuit memory based on programmable resistance memory, like phase change memory, and other memory technologies in which forming operations are utilized.

Description of Related Art

Some types of programmable resistance memory, including phase change memory (PCM), for example, comprise memory material that may not perform optimally until after a forming operation that involves exposure to a forming current. The forming operation can result in stabilized switching characteristics, for example, or better sensing margins.

Some of these materials may require forming current of relatively high magnitude. In some configurations, relatively high voltages may be required in the forming operation.

Various programmable resistance memory devices that utilize forming pulses include high density arrays of cells organized in a cross-point architecture, such as described in U.S. Pat. No. 6,579,760, entitled SELF-ALIGNED, PROGRAMMABLE PHASE CHANGE MEMORY, issued 17 Jun. 2003, by Lung. Cross-point architectures with memory cells that include a phase change memory element in series with an ovonic threshold switch have been developed as well. Other architectures are utilized, including a variety of 2-dimensional and 3-dimensional array structures.

In typical memory architectures, access to the memory cells in the array is made using access lines, such as bit lines and word lines, that are controlled using peripheral circuits implemented with low voltage CMOS transistors, or other technologies designed for high density and low power consumption. The high current or high voltage requirements of a forming operation may damage these peripheral circuits.

To avoid such damage, high voltage devices can be incorporated into the peripheral circuits. The high voltage devices, however, can have different device or circuit structures than are required in the peripheral circuits for normal operation of the memory. For example, CMOS transistors which can endure high voltage can be made using thicker gate insulators than are used in the other transistors on the memory. But this complicates the manufacturing process by introducing added steps for high voltage devices.

It is desirable to provide a high density memory array configured for forming operations, which can solve the high voltage damage problem and which can be compatible with the manufacturing processes used for the memory array and peripheral circuits.

SUMMARY

An integrated circuit technology is described that supports applying forming pulses to memory cells without damage to low-voltage circuitry on the integrated circuit.

In examples described herein, an integrated circuit comprises a set of pads that are configured for connection to external circuits, including a pad designated herein a "forming voltage pad." A memory array on the integrated circuit includes a plurality of memory cells and a plurality of access lines connected in current flow communication to memory cells in the array. A forming voltage rail is coupled to the forming voltage pad. A diode is disposed in current flow communication with the forming voltage rail and with an access line in the plurality of access lines of the memory array. The diode is configured to be forward biased during application of the forming voltage to the forming voltage pad to induce a forming current in the memory cells on the access line. Also, the diode is configured to be reverse biased during application of the reference voltage, such as ground, to the forming voltage pad during utilization of the memory array for memory operations.

A set of one or more diodes, including the just mentioned diode, can be included, in which each diode in the set is in current flow communication with the forming voltage rail and a particular access line or group of access lines. In this manner, the forming current can be delivered to sets of memory cells in the array with a number of diodes in parallel.

The integrated circuit in some embodiments can include peripheral circuits coupled to pads in the set of pads that are configured to receive signals, such as address signals, clock signals, data signals and control signals. The peripheral circuits can include a control circuit configured to execute memory operations. A power rail is provided on the integrated circuit that is coupled to at least one pad in a power supply subset of the set of pads on the integrated circuit. Power for the integrated circuit memory and the peripheral circuits is distributed using the power rail for the memory operations.

In some embodiments, the control circuit is also configured to execute a forming operation in which current through the forming voltage rail is applied to the memory cells via the plurality of access lines, and to execute memory operations in which current through the power rail is applied to memory cells via the plurality of access lines.

In one configuration, the control circuit is configured to forward bias the set of one or more diodes when a forming voltage is applied to the forming voltage pad during a forming operation. Conversely, in the memory operations, the control circuit is configured to reverse bias the set of one or more diodes when a reference voltage, such as ground, is applied to the forming voltage pad.

For example, the memory array can include a plurality of second access lines coupled in current flow communication with the memory cells. In the forming operation, the control circuit can apply a bias voltage to the plurality of second access lines which results in a forward bias on the set of one or more diodes when a forming voltage is applied to the forming voltage pad. Also, the control circuit can be configured to apply voltages during memory operations that reverse bias the set of one or more diodes when a reference voltage, such as ground, is applied to the forming voltage pad.

The technology described herein is applicable to arrays of memory cells that comprise any type of memory cell, such as a programmable resistance memory cell, in which a forming pulse is utilized. In one example, the memory array comprises phase change memory cells. In another example, the memory array comprises memory cells including phase change memory elements in series with ovonic threshold switches.

In some embodiments, the memory array on the integrated circuit can include a plurality of banks of memory cells. The integrated circuit can include separate forming voltage pads and separate forming voltage rails for each of the banks, configured as discussed above.

In some embodiments, the memory array on the integrated circuit can include a plurality of banks of memory cells. Each bank includes a set of N access lines connected to a set of N diodes. The integrated circuit can include a single forming voltage pad coupled to a set of N forming voltage rails through a selection circuit. The selection circuit has a set of N switches and is used to select access lines, including in some embodiments, one access line at a time in each bank of memory cells during a forming operation.

A method utilizing this technology is described. The method includes providing an integrated circuit having a memory array including a plurality of memory cells, a plurality of access lines connected in current flow communication to memory cells in the array, and a forming voltage pad in current flow communication via a diode with access lines in the plurality of access lines. The method includes applying a forming pulse to the forming voltage pad using an external power source, where the forming pulse has a voltage magnitude to forward bias the diode.

The method can include connecting the integrated circuit to a forming pulse system, which can be implemented using a test platform utilized in integrated circuit manufacturing and testing. The power supply of the forming pulse system can be used as an external power supply applying the forming pulse to the forming voltage pad on the integrated circuit. In this way, the forming pulse is applied prior to mounting the integrated circuit as a component of an operational device. Also, the method can include mounting the integrated circuit as a component of an operational device after applying the forming pulse, and connecting the forming pulse pad to a constant reference, such as ground, whereby the diode is reverse biased during operation of the device.

Other aspects and advantages of the present invention can be seen on review of the drawings, the detailed description and the claims, which follow.

DETAILED DESCRIPTION

A detailed description of embodiments of the present invention is provided with reference to the FIGS. 1-11.

Figure 1:
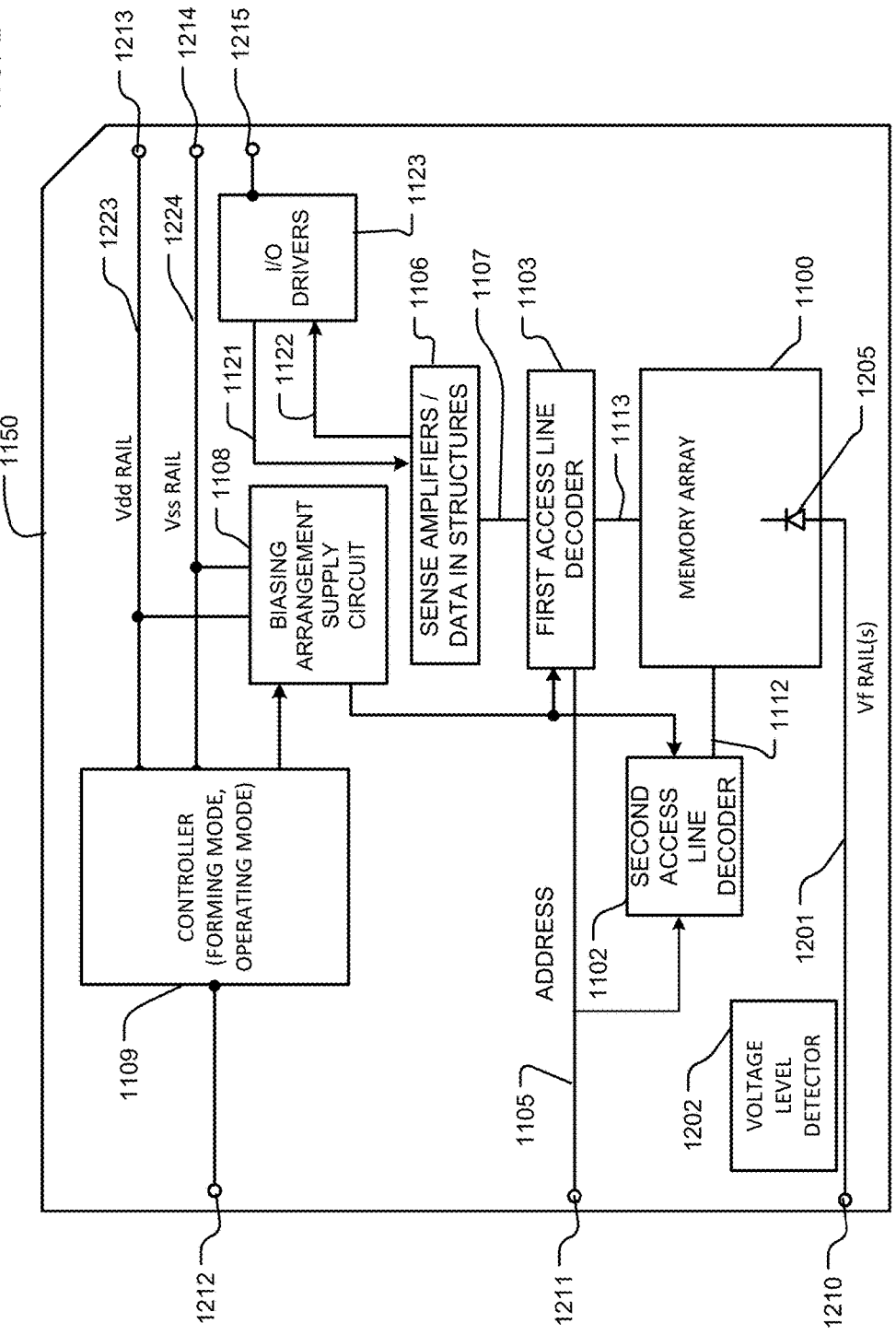
FIG. 1 is a simplified block diagram of an integrated circuit which includes a memory array and a forming voltage pad, according to one embodiment.

FIG. 1 shows an integrated circuit 1150 including a memory array 1100 comprising memory cells to be subject to a forming operation. The integrated circuit 1150 includes a set of pads 1210-1215 in this figure. The pads are structures on the integrated circuit that are configured for connection to external wiring. The set of pads includes signal pads (e.g. 1211, 1212, 1215) configured to carry signals such as addresses, control signals like chip select signals, clock signals, data signals and so on. The set of pads includes a power supply pad 1213 and a ground pad 1214 by which power is applied to the integrated circuit for use during normal operation. In some embodiments, there may be a plurality of power supply pads and ground pads.

Also, a forming voltage pad 1210 is included in the set of pads. In some embodiments, there may be a plurality of forming voltage pads as discussed below.

The signal pads are coupled to circuitry on the integrated circuit via wiring layers on the device. The power supply pad 1213 and the ground pad 1214 are connected to power rails (Vdd rail 1223, ground or Vss rail 1224) which distribute the supply voltages to the memory array 1100 and peripheral circuitry, where the "peripheral circuitry" includes the circuits on the device other than the memory array. The power rails are typically patterned metal layers at the top of the plurality of metal layers, or close to the top. Of course, other conductive structures can be used for the power supply rails for distribution of the supply voltages. The peripheral circuitry can include CMOS transistors having breakdown voltages that are less than a forming voltage Vf applied to the forming voltage pad during a forming operation. According to one preferred embodiment of the technology described herein, the forming voltage and forming current are applied to the memory cells without utilization of high-voltage CMOS transistors or other special circuitry is designed to handle the high-voltage or high current required during forming operations. In an advantageous embodiment, the peripheral circuits comprise CMOS transistors, and all of the CMOS transistors in the peripheral circuits have a breakdown voltage that is less than a forming voltage Vf applied to the forming voltage pad and, as a result, manufacturing processes can be simplified. Other embodiments may use high-voltage CMOS transistors in the peripheral circuits, while taking advantage of the improved processes and structures herein.

A forming voltage rail 1201 is connected to the forming voltage pad 1210 and to the set of diodes 1205. The forming voltage rail can be separate from and electrically isolated from the power rails. The forming voltage rail 1201 provides current flow connection between the forming voltage pad 1210 and the set of diodes 1205. The forming voltage rail 1201 can comprise a patterned metal line on the same patterned metal layer as the power supply rails in some embodiments. In other embodiments, the forming voltage rail 1201 can be other types of conductive structures. The forming voltage rail 1201 in preferred embodiments is connected directly, without intervening active devices, such as high-voltage transistors, between the forming voltage pad 1210 and the diode or diodes in the set of diodes 1205. In the illustrated example, a voltage level detector 1202 may be coupled to the forming voltage rail or forming voltage pad, which can generate a signal used by the controller 1109 to initiate a forming operation. Other embodiments do not include a voltage detector coupled to the forming voltage rail or pad.

The memory array includes a plurality of access lines 1112, 1113. In some embodiments, the memory array includes first access lines 1113, such as bit lines, and second access lines 1112, such as word lines or source lines. In some embodiments, in which the second access lines 1112 are source lines, the array may include word lines, in addition, for controlling the switch elements in the memory cells.

The set of diodes (represented by symbol 1205) has one or more members, and includes diodes connected in series with access lines in the plurality of access lines. In this manner, the forming voltage pad 1210 is connected in current flow communication via the forming voltage rail 1201, the set of diodes 1205, and the first access lines (e.g. 1113) directly to memory cells in the memory array 1100, and through the memory cells to the second access lines (e.g. 1112). In some embodiments, the set of diodes may be coupled to the second access lines 1112, rather than the first access lines 1113.

In the memory array 1100, in one aspect of the technology described here, each memory cell has a switch element such as an ovonic threshold switch, and a memory element such as a phase change memory element connected in current flow communication with the first and second access lines, such as a bit line and a word line. A first access line decoder 1103 is coupled to and in electrical communication with the plurality of first access lines 1113, which are arranged as columns in the memory array 1100 for reading data from, and writing data to, the memory cells in the memory array 1100. The first access line decoder 1103 can comprise first access line drivers. A second access line decoder 1102 is coupled to, and in electrical communication with, the plurality of second access lines 1112, which are arranged as rows in the memory array 1100. The second access line decoder 1102 can comprise second access line drivers that apply bias voltages to the second access lines 1112 under control of the controller and of address decoding. Addresses are supplied on bus 1105 to the first access line decoder 1103, and second access line decoder 1102. Sense amplifiers and other supporting circuitry such as pre-charge circuits, and so on, along with data-in structures in block 1106, are coupled to the first access line decoder 1103 via the bus 1107 in this embodiment. These circuit structures can apply bias voltages to the first access lines 1113 under control of the controller and of address decoding. Data is supplied via the data-in line 1121 from input/output drivers 1123 coupled to pads (1215) on the integrated circuit 1150 or other data sources, to the data-in structures in block 1106. Data is supplied via the data-out line 1122 from the sense amplifiers in block 1106 to input/output drivers 1123 on the integrated circuit 1150, or to other data destinations internal or external to the integrated circuit 1150.

A state machine, or other logic in controller 1109, controls a biasing arrangement supply circuit 1108 to execute memory operations, such as write (set and reset) and read operations. The biasing arrangement supply circuit 1108 is coupled to a Vdd rail 1223 which is connected to the power supply pad 1213, and is coupled to a Vss rail 1224 which is connected to the ground pad 1214. The biasing arrangement supply circuit 1108 can comprise level shifters or charge pumps to provide bias arrangements with different voltage levels other than Vdd, and deliver the required bias arrangement for the write and read operations to the first access line decoder 1103 and second access line decoder 1102. Also, control circuitry in the controller 1109 coordinates operation of sense circuitry and the data-in structures in block 1106, for read and write operations. The circuitry can be implemented using special purpose logic, a general purpose processor or a combination thereof.

The controller 1109 is configured to execute a forming operation in response to command decoding, voltage level detector signals, or other types of signals, in which current through the forming voltage rail is applied to the memory cells via the plurality of access lines, and to execute memory operations in which current through the power rail is applied to memory cells via the plurality of access lines. During the forming operation, the first access lines 1113 and the second access lines 1112 can be biased with a voltage that results in forward biasing of the diodes in the set of diodes 1205 when the forming voltage pad 1210 is coupled to a forming voltage Vf, so that the forming pulse causes flow of a forming current pulse through the memory cells. The controller 1109 can selectively activate separate banks of memory cells in the array, in some embodiments, in order to manage peak current flow through the forming voltage rail.

During normal operation of the memory integrated circuit, the controller 1109 is configured to apply bias voltages to the access lines which reverse biases the diode or diodes in the set of diodes 1205 when the forming voltage pad 1210 is coupled to a reference voltage such as ground.

Figure 2:
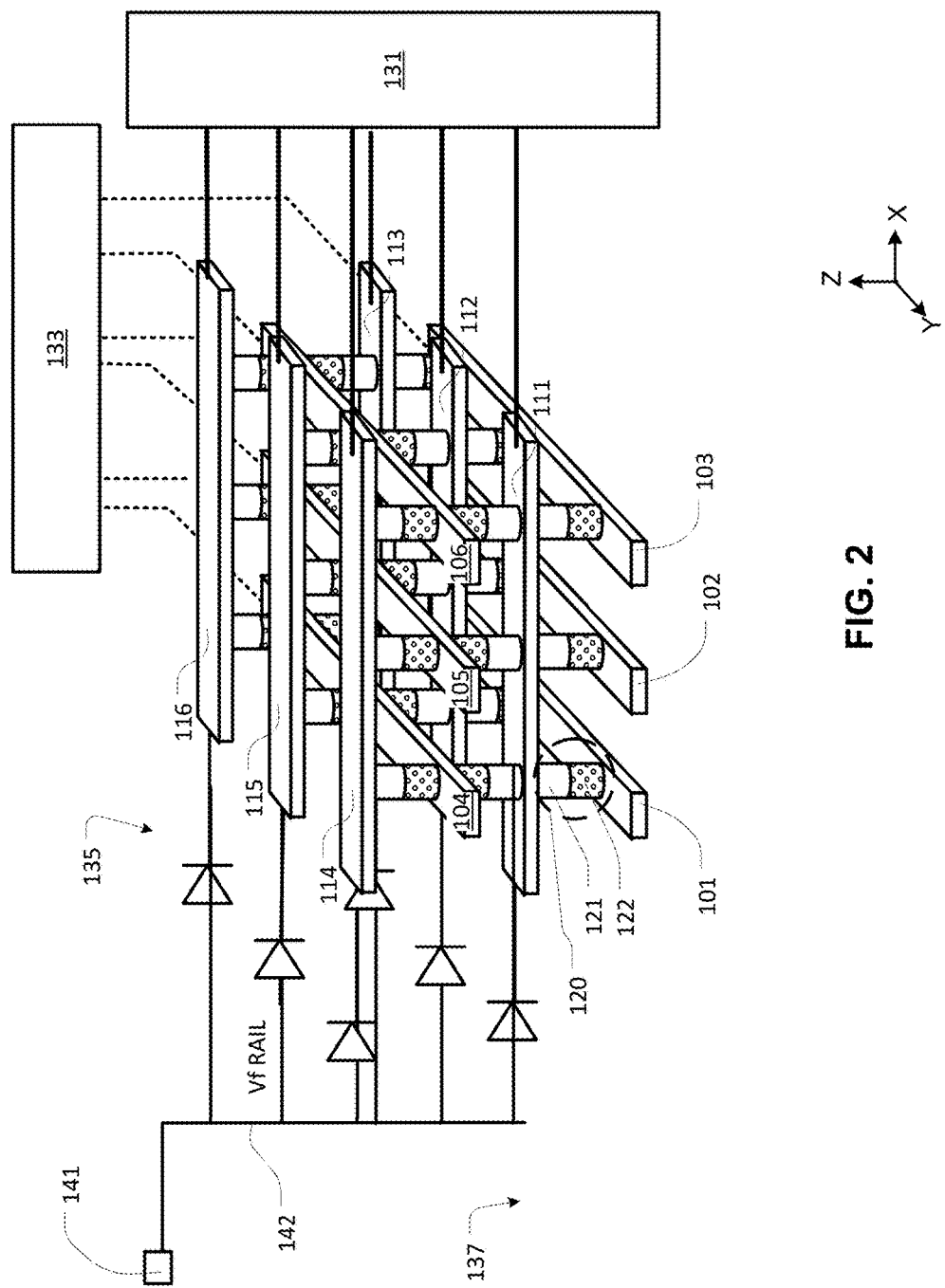
FIG. 2 is a perspective view of a 3D cross-point array including forming voltage pads and diodes according to one embodiment.

FIG. 2 is a perspective view of a 3D cross-point array. The 3D cross-point array comprises a plurality of memory cells, including memory cell 120, disposed at respective cross-points of a plurality of first access lines, such as bit lines, (e.g. 111, 112, 113, 114, 115, and 116), and a plurality of second access lines, such as word lines (e.g. 101, 102, 103, 104, 105, and 106). Each memory cell has a cell structure that provides a switch function and a data storage function. In this example, the cell has a cell structure including a switch element (e.g. 121) and a memory element (e.g. 122).

In the illustration, a first level in the 3D cross-point array is interposed between a first patterned conductor layer of second access lines, including second access lines (word lines) 101, 102, and 103, and a second patterned conductor layer of first access lines, including first access lines (bit lines) 111, 112, and 113. A second level in the 3D cross-point array is interposed between the second patterned conductor layer of first access lines, including first access lines (bit lines) 111, 112, and 113, and a third patterned conductor layer of second access lines, including second access lines (word lines) 104, 105, and 106. A third level in the 3D cross-point array is interposed between the third patterned conductor layer of second access lines, including second access lines (word lines) 104, 105, and 106, and a fourth patterned conductor layer of first access lines, including first access lines (bit lines) 114, 115, and 116. In this embodiment, the consecutive levels share a patterned conductor layer of first or second access lines, and the memory cells are inverted such that the memory elements can be in contact with or proximal to a second access line and the switch element can be in contact with or proximal to a first access line. In some embodiments, each level can have its own conductive layers of first and second access lines. In some embodiments, the memory cells are not inverted such that the switch elements can be in contact with the first access lines or second access lines. An array implemented in the configuration of FIG. 1 can have many levels, and many first access lines and second access lines in each level for formation of very high density memory devices. Other 3D configurations can be implemented.

The 3D cross-point array includes access lines coupled to and in electrical communication with a first access line decoder 131 and a second access line decoder 133, where the first and second access line decoders can include drivers and bias voltage selectors to apply bias voltages to selected and unselected first access lines and second access lines in the write or read operation. In this embodiment, the plurality of first access lines is coupled to a first access line decoder 131 and the plurality of second access lines is coupled to a second access line decoder 133. A plurality of diodes (e.g. 135, 137) is disposed on the circuit between a forming voltage rail and corresponding access lines. As illustrated, each diode has a first terminal and a second terminal. The first terminal of diode 135 is connected to an access line (bit line) in a first level (e.g., 114, 115, 116). Likewise, the first terminal of diode 137 is connected to an access line (bit line) in a second level (e.g., 111, 112, 113). The forming voltage pad 141 is connected to a forming voltage Vf rail 142, which connects to second terminals of the diodes (e.g. 135, 137). The Vf rail 142 receives a forming voltage Vf during a forming operation. The forming voltage pad is configured to connect to an external power source, and can be independent of on-chip sources.

Figure 3:
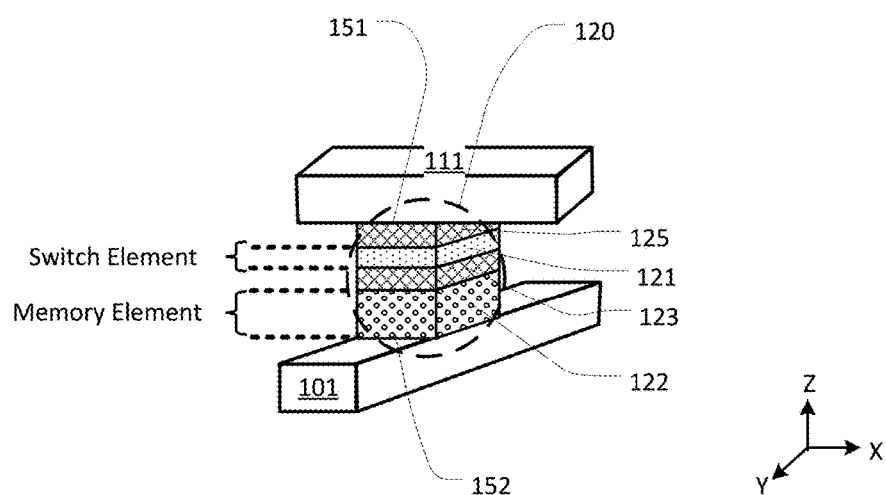
FIG. 3 is a close-up view of a memory cell 120 in FIG. 2.

FIG. 3 is a close-up view of an example memory cell 120 in FIG. 2. Memory cell 120 is in contact with the first access line (bit line) 111, and in contact with the second access line (word line) 101. Memory cell 120 includes a switch element 121 proximal to the first access line (bit line) 111 at surface 151, and a memory element 122 proximal to the second access line (word line) 101 at surface 152. A first barrier layer 123 is disposed between the switch element 121 and the memory element 122. A second barrier layer 125 is disposed between the switch element 121 and the surface 151 of the first access line (bit line) 111. The switch element 121, for example, can be a two-terminal, bi-directional ovonic threshold switch (OTS), which comprises a chalcogenide material.

In one example, the switch element 121 can comprise a layer of chalcogenide selected for use as an ovonic threshold switch, such as $As_2Se_3$, ZnTe, and GeSe, and has for example a thickness of about 5 nm to about 25 nm, preferably about 15 nm. In some embodiments, the switch element 121 can comprise a chalcogenide in combination with one or more elements from the group consisting of tellurium (Te), selenium (Se), germanium (Ge), silicon (Si), arsenic (As), titanium (Ti), sulfur (S) and antimony (Sb).

The first barrier layer 123 can provide adhesion and diffusion barrier functions between the switch element 121 and the memory element 122. The first barrier layer 123 may have a layer of conductive material with a thickness of about 5 to about 50 nm, preferably about 20 nm. Example materials for the first barrier layer 123 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, first barrier layer 123 can comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

The second barrier layer 125 can provide adhesion and diffusion barrier functions between the switch element 121 and the first access line (bit line) 111. The second barrier layer 125 can have the same material as the first barrier layer 123, such as TiN. In some embodiments, the second barrier layer 125 can have a different material than the first barrier layer 123. In some embodiments, the second barrier layer 125 can be eliminated such that the switch element 121 is in contact with the first access line (bit line) 111.

The memory element 122 can comprise a layer of programmable resistance material, for example, a layer of phase change material having a thickness of about 10 nm to about 50 nm, preferably about 30 nm. The thickness of the phase change memory element can be greater than the thickness of switch element 121 in some embodiments. The memory element 122 can comprise, for example, $Ge_2Sb_2Te_5$, in a pure stoichiometric form or in a form with additives or dopants, such as dielectric additives. Phase change materials are capable of being switched between a relatively low resistance state, amorphous phase, and a relatively high resistance state, crystalline phase, by application of energy such as heat or electrical current. In some embodiments, multilevel cells having multiple resistance states can be used.

Embodiments of materials for the memory element 122 can include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example dielectric doped $Ge_2Sb_2Te_5$, $GeSb_2Te_4$ and $GeSb_4Te_7$. In some embodiments, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials that may be useful are disclosed in Ovshinsky, U.S. Pat. No. 5,687,112 at columns 11-13, which examples are incorporated by reference.

The memory element 122 can comprise a layer of chalcogenide and other phase change materials with additives to modify conductivity, transition temperature, melting temperature, and other properties. Representative additives can include nitrogen (N), silicon (Si), oxygen (O), silicon dioxide (SiOx), silicon nitride (SiN), copper (Cu), silver (Ag), gold (Au), aluminum (Al), aluminum oxide ($Al_2O_3$), tantalum (Ta), tantalum oxide (TaOx), tantalum nitride (TaN), titanium (Ti), and titanium oxide (TiOx).

In some embodiments, other resistive memory structures can be implemented, such as metal-oxide resistive memories, magnetic resistive memories and conducting-bridge resistive memories.

The first access lines (bit lines) and the second access lines (word lines) can comprise a variety of metals, metallike materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the memory element 122. Likewise, the material selected for the first access lines is preferably selected for compatibility with the second barrier layer 125.

In another embodiment, a bottom electrode (not shown) having a smaller contact surface than the surface of the memory element is interposed between the memory element 122 and the switch element 121 or between the memory element 122 and the second access line (word line) 101. As such, an increased current density at the contact in the memory element can be achieved. Such bottom electrode may comprise titanium nitride (TiN), tantalum nitride (TaN), titanium silicon nitride (TiSiN), titanium aluminum nitride (TiAlN), tantalum aluminum nitride (TaAlN), and tungsten nitride (WN). The bottom electrode in contact with the active region of the phase change material is sometimes referred to as a "heater," reflecting embodiments in which the electrode can have relatively high resistance, and contributes to the Joule heating in the active region of the phase change material.

Figure 4:
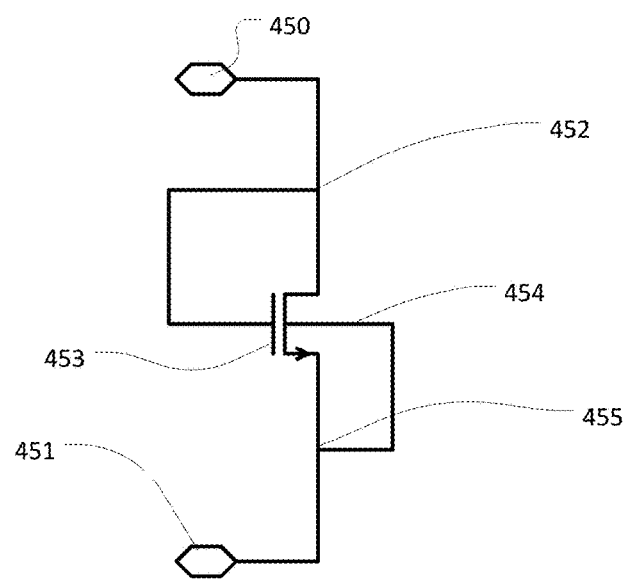
FIG. 4 illustrates an arrangement of diodes and a forming voltage pad in a level of a 3D memory array embedded in an integrated circuit according to another embodiment.

FIG. 4 is a schematic illustration of a structure configured as a diode that can be used in circuits as described herein. The illustrated structure can be characterized as a diode-connected NMOS transistor. The diode has an anode 450 and a cathode 451. The drain 452 and the gate 453 of the transistor are connected together to act as the anode 450. The body 454 and the source 455 of the transistor are connected together to act as a cathode 451. The sizes of the source 455, drain 452, a channel within the body 454, and the gate 453, and the thickness of the gate dielectric, can be configured as suits a particular embodiment, along with other characteristics of the structure. The diodes utilized can also comprise diode-connected PMOS transistors, P+/Nwell diodes which comprise a highly doped p-type contact formed within a n-type well on the substrate, Psub/N+ diodes which comprise a highly doped n-type contact formed in a p-type substrate, and other diode structures.

Figure 5:
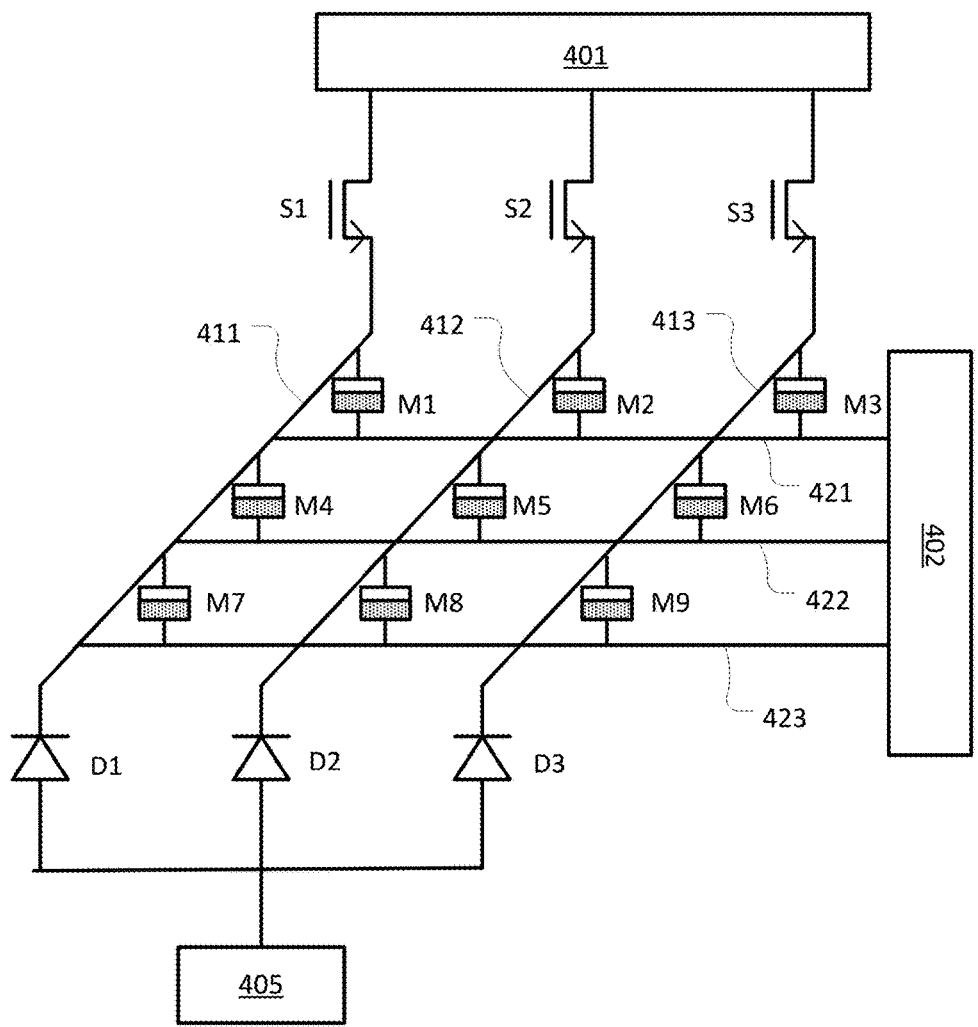
FIG. 5 illustrates an embodiment of a diode that can be used in an arrangement like that of FIG. 4.

FIG. 5 illustrates an arrangement of diodes D1, D2, D3 and a forming voltage pad 405 connected in current flow communication with first access lines 411, 412, 413 in a level of a 3D memory array embedded in an integrated circuit according to an embodiment. In the illustration, a plurality of memory cells (e.g. M1~M9) is disposed between and in current flow communication with a plurality of first access lines (e.g. 411, 412, 413) and a plurality of second access lines (e.g. 421, 422, 423). Each memory cell includes a switch element and a memory element. The plurality of first access lines is coupled to a first access line decoder 401 through selectors S1, S2, S3, and the plurality of second access lines is coupled to a second access line decoder 402. Each of diodes D1, D2, D3 has a first terminal and a second terminal, and each first terminal is connected to respective first access lines. A forming voltage pad 405 is connected via a forming voltage rail to the second terminal of the diode (e.g. D1~D3). In this embodiment, the first terminal of the diode is a cathode, and the second terminal is an anode.

During the forming operation, the gates of the selectors S1, S2, S3 are applied a voltage that can be for example about half of the forming voltage. In one example, the forming voltage may be 5 Volts, and the gates of the selectors S1, S2, S3 are biased at about 2.5 Volts, well below a breakdown voltage for the selectors. This sets a gate to access line voltage below the VGS breakdown threshold for the transistors. Meanwhile, the second access lines 421, 422, 423 are coupled to ground Vss through the second access line decoder 402. The voltage on the second access line decoder 402 will be lower than the forming voltage as a result of the resistive voltage drop across the memory cells. As a result, a forming current flows from the pad 405 through the diodes D1, D2, D3, to the first access lines 411-412, to the memory cells M1-M9, and to the second access lines 421-423 to ground without flowing through switching devices and without causing breakdown voltage stress on any switching devices.

During the write and read operation, the forming voltage pad 405 receives a reference voltage, such a ground Vss, so that the diodes D1, D2, D3 are reverse biased.

Figure 6:
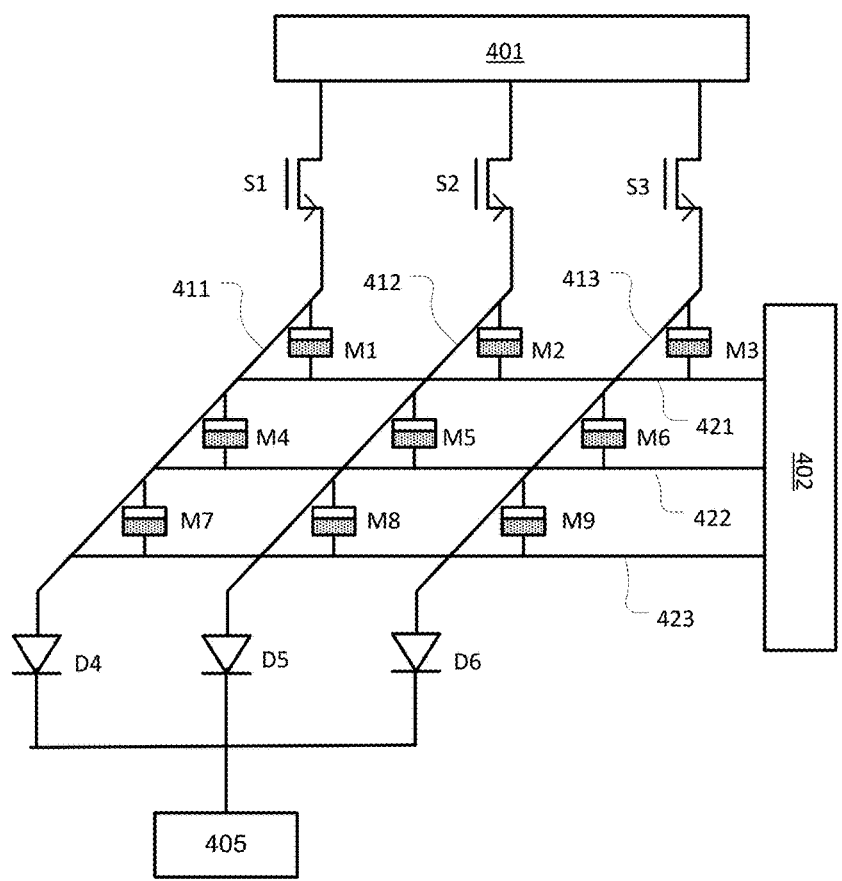
FIG. 6 illustrates an arrangement of diodes and a forming voltage pad in a level of a 3D memory array according to yet another embodiment.

FIG. 6 illustrates an arrangement of diodes D4, D5, D6 and a forming voltage pad in a level of a 3D memory array according to yet another embodiment. The arrangement of FIG. 6 differs from that of FIG. 4 in that the diodes D4, D5, D6 are reversely connected. In this embodiment, the first terminal of the diode is an anode, and the second terminal is a cathode.

During the forming operation, the forming voltage pad 405 is supplied with a negative forming voltage Vf. Even though the diodes D4, D5, D6 are reverse connected, the diodes D4, D5, D6 remain forward biased because the forming voltage has a lower potential energy relative to a voltage applied through the second access lines 421, 422, 423, which can be set at a reference voltage Vss through the second access line decoder 402.

During the write and read operations, the forming voltage pad 405 receives a reference voltage such as Vdd outputted from the pad power supply circuit such that the diodes D1, D2, D3 are reverse biased.

Figure 7:
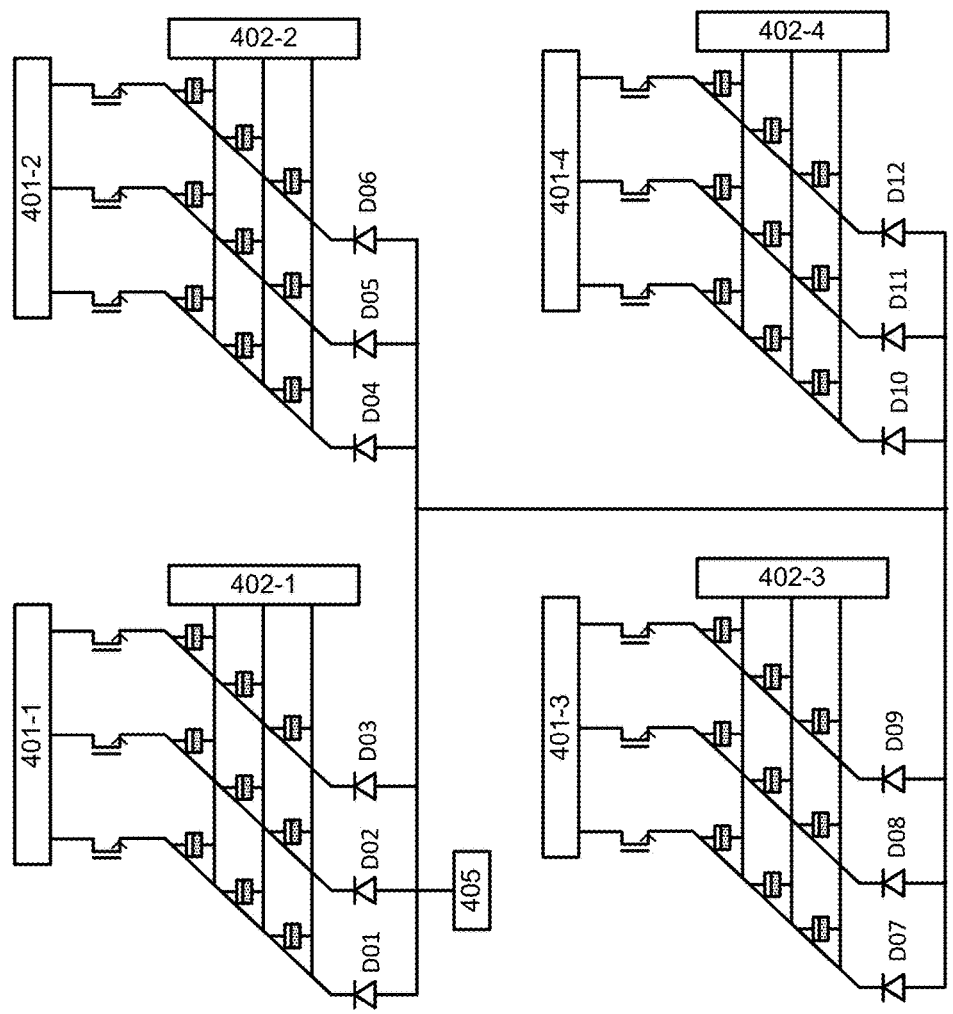
FIG. 7 illustrates connection among a plurality of banks in a memory array according to one embodiment.

FIG. 7 illustrates connection among a plurality of banks in a memory array according to one embodiment. The plurality of memory cells in the memory array is divided into a plurality of banks. The plurality of banks comprise their own first access line decoders (e.g. 401-1, 401-2, 401-3, 401-4) and second access line decoders (e.g. 402-1, 402-2, 402-3, 402-4). In this illustrated configuration, each of the diodes is connected to the respective first access lines, and connected together to a forming voltage pad 405. The forming voltage pad 405 is supplied to the forming voltage Vf to forward bias the diodes (e.g. D01~D12) in the forming operation, and is supplied to the reference voltage Vss to reverse bias the diodes (e.g. D01~D12) in the write and read operations.

Figure 8:
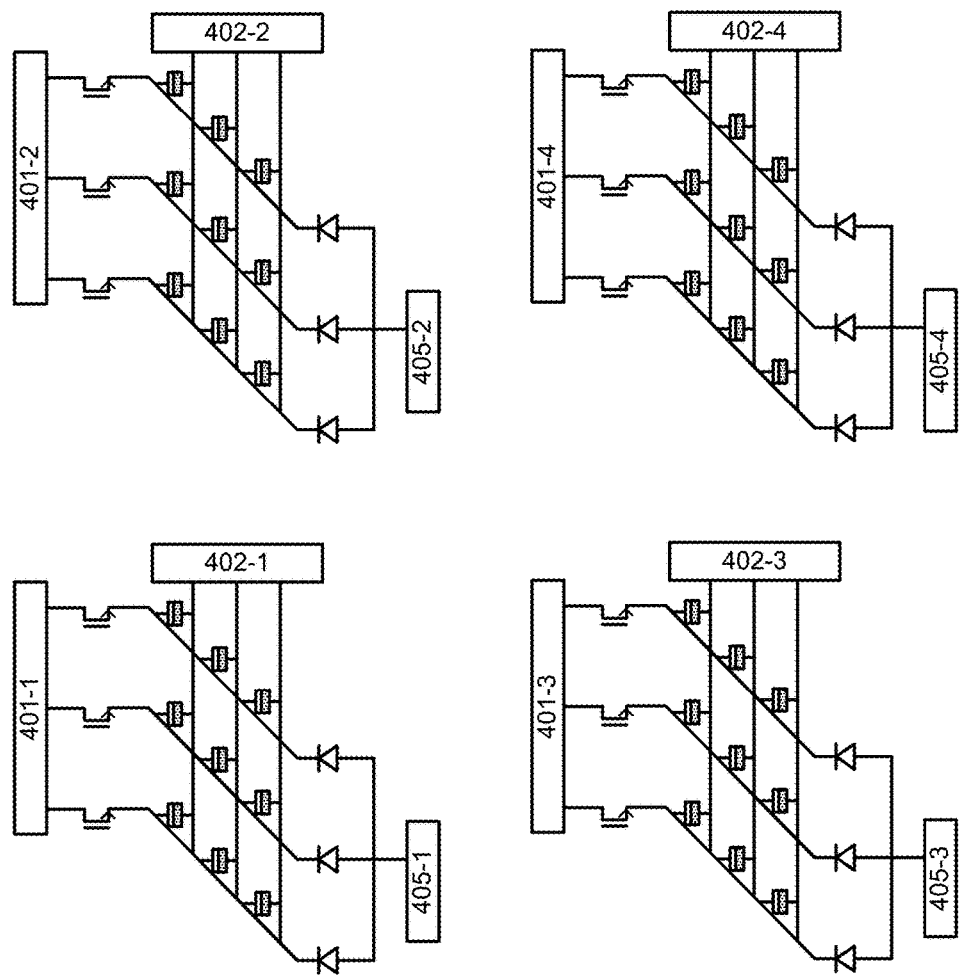
FIG. 8 illustrates connection among a plurality of banks in a memory array according to another embodiment.

FIG. 8 illustrates connection among a plurality of banks in a memory array according to another embodiment. Compared to FIG. 7, FIG. 8 differs in that each bank has a separate forming voltage pad (e.g. 405-1, 405-2, 405-3, 405-4) and separate forming voltage rail. The forming voltage pads can have their respective pad power supply circuits coupled to an external power source through the Vf rail. In some embodiments, the forming voltage pads can share a common pad power supply circuit.

Figure 9:
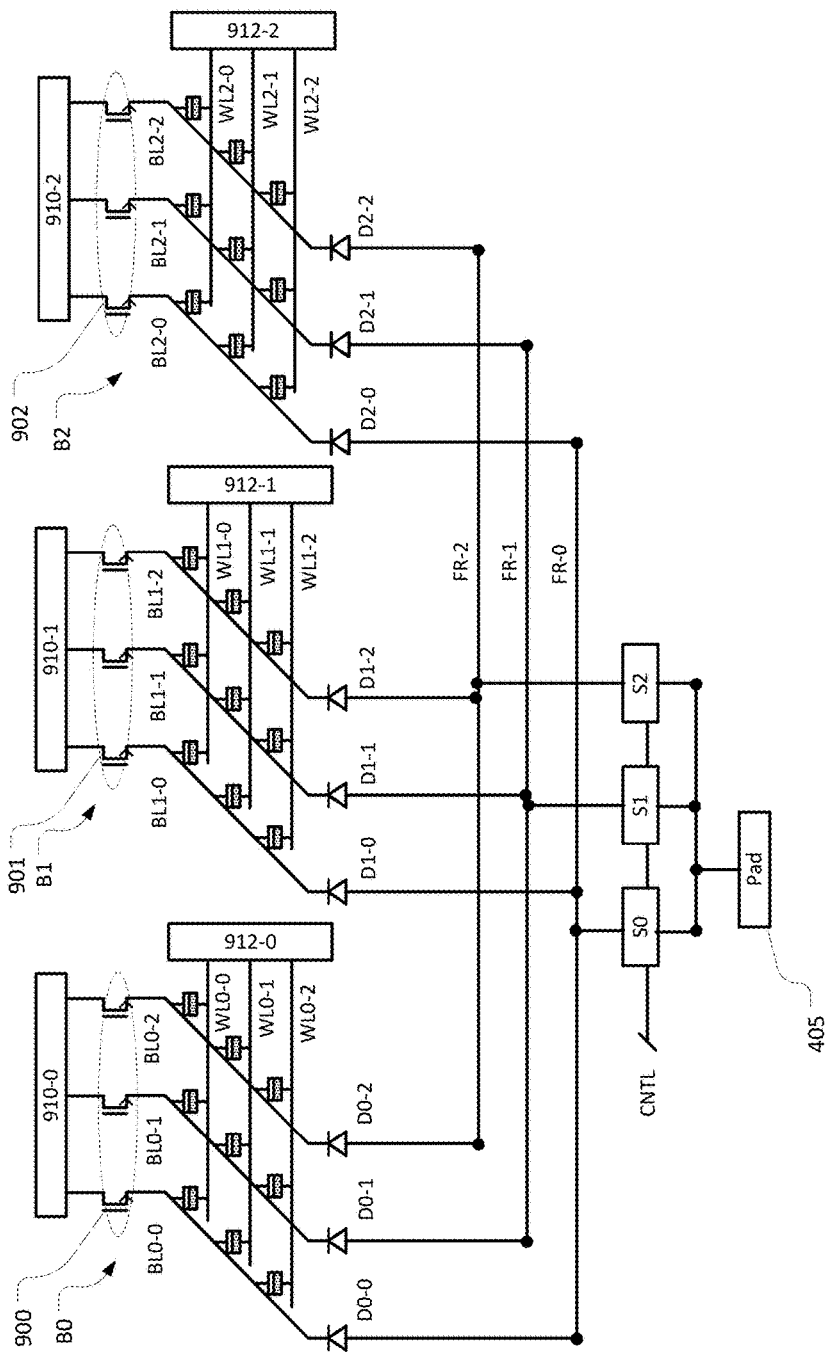
FIG. 9 is a simplified schematic diagram of yet another embodiment, including multiple banks of memory cells.

FIG. 9 is a simplified schematic of a memory array that includes a plurality of banks of memory cells, including banks B0, B1 and B2, in this example. A memory array as shown in FIG. 9 can be part of an integrated circuit as shown in FIG. 1, for example. The banks can be configured to lie on different levels of a 3D memory array, or distributed in different configurations as suits a particular implementation.

Each bank includes a plurality of word lines and a plurality of bit lines both of which are connected in current flow communication with memory cells in the bank, in this example. In this simplified schematic, each bank includes three word lines and the three bit lines. Thus, each bank includes a set of N access lines, configured as one of bit lines and word lines, where N is equal to three in this example. Of course, N can be any practical number.

In the illustration, bank B0 includes bit lines BL0-0, BL0-1 and BL0-2, and word lines WL0-0, WL0-1 and WL0-2. Bank B1 includes bit lines BL1-0, BL1-1 and BL1-2, and word lines WL1-0, WL1-1 and WL1-2. Bank B2 includes bit lines BL2-0, BL2-1 and BL2-2, and word lines WL2-0, WL2-1 and WL2-2. The bit lines are connected to read and write circuits 910-0, 910-1 and 910-2 in each bank. The word lines are connected to word line drivers 912-0, 912-1 and 912-2 in each bank. Column select switches 900, 901 and 902 in each bank are configured to connect selected bit lines to the read and write circuits 910-0, 910-1 and 910-2.

As illustrated, there is a plurality of sets of diodes. Each set of diodes in the plurality of sets is coupled to a corresponding bank in the plurality of banks. A set of diodes D0-0, D0-1 and D0-2 is coupled to bank B0. A set of diodes D1-0, D1-1 and D1-2 is coupled to bank B1. A set of diodes D2-0, D2-1 and D2-2 is coupled to bank B2. Each set of diodes has N members, which in this example is three members. The members in each of the set of diodes are connected in current flow communication with corresponding ones of the N access lines in its corresponding bank. Thus, for bank B0, diode D0-0 is connected in current flow communication with its corresponding bit line BL0-0; diode D0-1 is connected in current flow communication with its corresponding bit line BL0-1; and diode D0-2 is connected in current flow communication with its corresponding bit line BL0-2.

In this embodiment, there is a set of forming voltage rails having N members, which in this example includes forming voltage rails FR-0, FR-1 and FR-2. As shown, the N members of each set of diodes are connected in current flow communication with corresponding ones of the N members of the set of forming voltage rails. Thus, forming voltage rail FR-0 is connected in current flow communication with (and corresponds to) diode D0-0 which is coupled with bit line BL0-0 in bank B0, with diode D1-0 which is coupled with bit line BL1-0 in bank B1 and with diode D2-0 which is coupled with bit line BL2-0 in bank B2. Forming voltage rail FR-1 is connected in current flow communication with diode D0-1 which is coupled with bit line BL0-1 in bank B0, with diode D1-1 which is coupled with bit line BL1-1 in bank B1 and with diode D2-1 which is coupled with bit line BL2-1 in bank B2. Forming voltage rail FR-2 is connected in current flow communication with diode D0-2 which is coupled with bit line BL0-2 in bank B0, with diode D1-2 which is coupled with bit line BL1-2 in bank B1 and with diode D2-2 which is coupled with bit line BL2-2 in bank B2.

In this embodiment, there is a single forming voltage pad 405. The forming voltage pad 405 is coupled to a selection circuit including a set of switches having N members, where switches in the set have a first terminal in current flow communication with the forming voltage pad 405, and a second terminal in current flow communication with a corresponding forming voltage rail in the set of forming voltage rails. Thus, switch S0 is coupled between the forming voltage pad 405, and forming voltage rail FR-0. Switch S1 is coupled between the forming voltage pad 405, and forming voltage rail FR-1. Switch S2 is coupled between the forming voltage pad 405, and forming voltage rail FR-2. Control signals CNTL generated by control circuitry on the integrated circuit, or by off-chip test platforms for example, cause the switches in the selection circuit to electrically connect and disconnect the forming voltage pad 405 from their corresponding forming voltage rails in response to a control sequence. The control circuit on the integrated circuit, in some embodiments, is configured to execute a forming operation including the control sequence, including providing the control signal CNTL. The control sequence can include connecting in sequence each of the forming voltage rails in the set of forming voltage rails to memory cells via the corresponding ones of the N access lines. This enables a sequence for example, which applies a forming voltage in coordination with the word line drivers and the read and write circuitry to one cell in each bank at a time. Of course other configurations can be implemented.

In one example, during a forming operation, a high voltage such as 5 V is applied to the forming pad 405. A control voltage is applied to the column select switches (900, 901, 902) on each of the bit lines that is less than the breakdown voltage of the device, such as 2.5 V, thereby avoiding device stress. A ground voltage is applied to a selected word line in each bank as determined by the word line drivers 912-0, 912-1, 912-2. Unselected word lines receive an intermediate voltage, such as 2.5 V to improve current distribution uniformity. The plurality of switches S0-S2 act as a selection circuit that is used for column decoding on the bit lines, thereby selecting a single bit line at a time in each bank. Thus, one of the switches S0-S2 is turned on at a time, while the other two are turned off for each step of the control sequence.

Of course other embodiments may select more than one cell at a time in each bank.

During normal operation of the memory device, the forming voltage pad is connected to ground and the switches are enabled to pass ground voltage to the forming voltage rails.

In advantageous embodiments, the column select transistors in the column decoder circuit on the bit lines are implemented using transistors having characteristics manufacturable along with the peripheral circuits, which comprise devices that have a breakdown voltage less than the forming voltage. Likewise, the switches S0-S2 in the selector circuit are implemented in advantageous embodiments using transistors having characteristics manufacturable along with the peripheral circuits, which comprise devices that have low breakdown voltages less than the forming voltage.

Figure 10A:
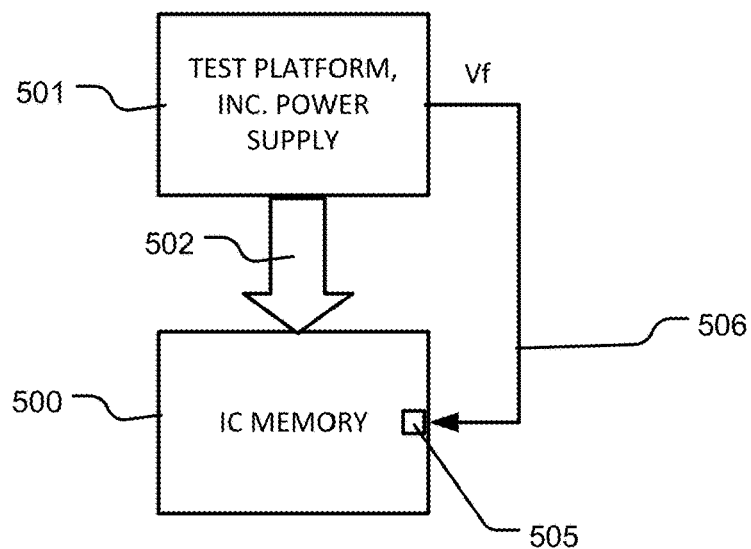
FIGS. 10A and 10B illustrate connection of an integrated circuit with a forming voltage system for executing a forming operation, and an integrated circuit mounted on an operational device, including grounding the forming voltage pad.

FIG. 10A illustrates a configuration in which an integrated circuit memory 500, such as that shown in FIG. 1, is coupled to a test platform 501 that is used as a forming pulse system to apply forming pulses as described above. The test platform 501 can include a jig 502 or other structure designed for connection to contact pads or pins on the integrated circuit memory 500. A power supply in the test platform 501 can be used to generate a forming voltage Vf, and apply that voltage on line 506 to the forming voltage pad 505 on the integrated circuit memory 500, directly using a probe or via a pin on a packaged version of the integrated circuit memory 500 for example.

Figure 10B:
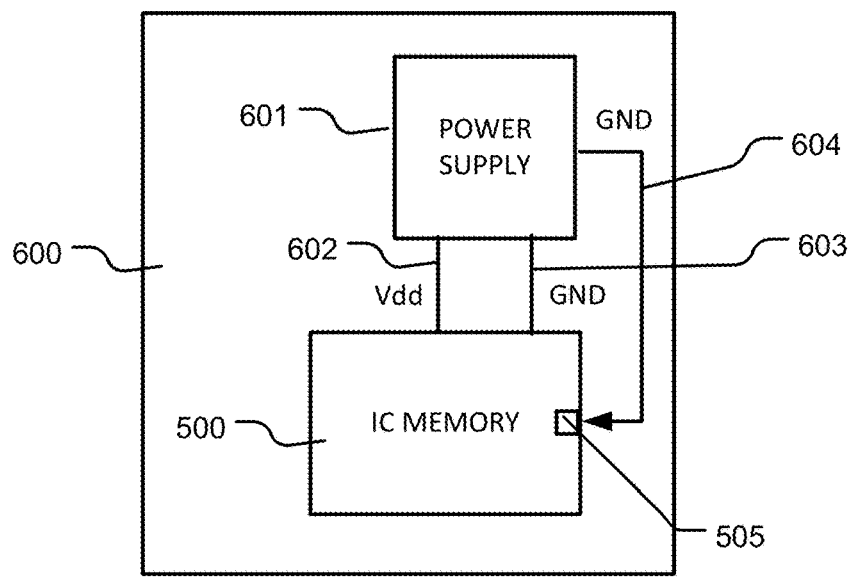

FIG. 10B illustrates the integrated circuit memory 500 mounted on an operational device 600. The operational device 600 can comprise, for a generic example, a printed circuit board with a variety of other circuits in integrated circuits mounted thereon, for example. The operational device 600 includes a power supply 601 that applies a power supply voltage Vdd and a ground voltage GND on lines 602 and 603, respectively, to power supply and ground pads on the integrated circuit memory 500. In this operational device 600, a reference voltage such as ground GND is applied on line 604 to the forming voltage pad 505 when it is mounted on the operational device.

Figure 11:
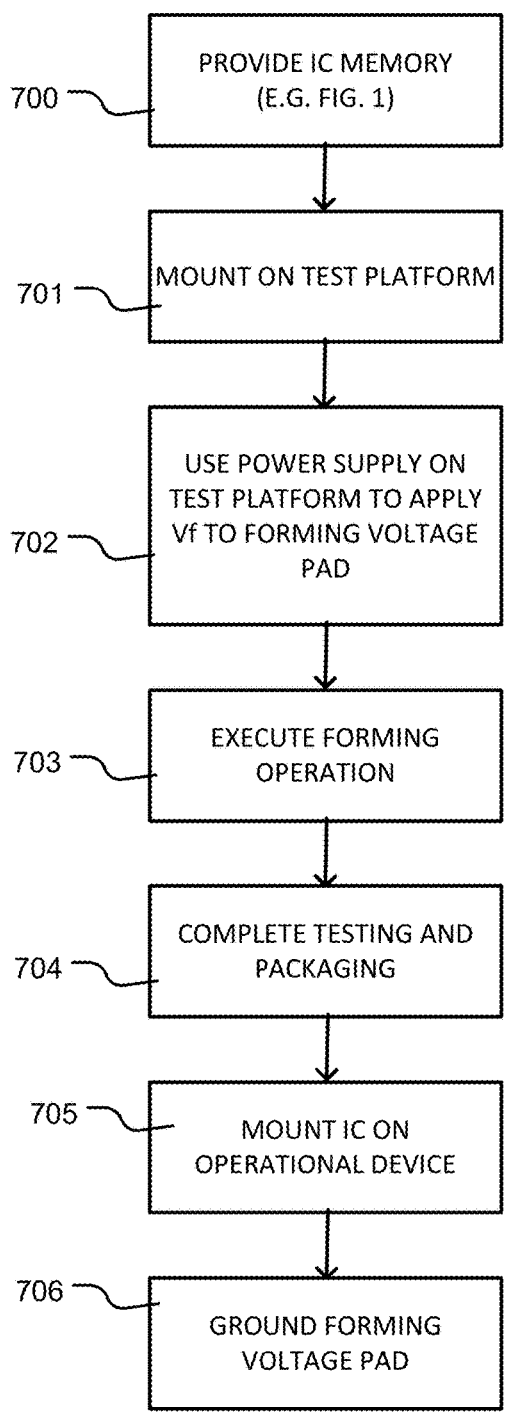
FIG. 11 is a flow chart of a method including a forming operation as described herein.

A method for performing a forming operation on integrated circuit memory is provided. FIG. 11 is a simplified flowchart illustrating steps in the method. The first step in the illustrated flowchart is providing an integrated circuit memory, such as that illustrated in FIG. 1. (700). The integrated circuit memory is mounted on a test platform, or other forming pulse system (701). A power supply on the test platform is used to apply a forming voltage Vf to the forming voltage pad on the integrated circuit (702). The forming operation is executed by bias in the access lines as required in order to deliver forming pulses to all of the memory cells in the array, such as in a bank-by-bank sequence (703). After the forming operation, the test platform can execute other testing operations in some embodiments, and packaging of the integrated circuit can be completed if it has not been completed prior to mounting on the test platform (704). Thereafter, the integrated circuit is mounted on an operational device (705). The forming voltage pad is tied on the operational device to ground or another reference voltage necessary to maintain the diodes on the integrated circuit memory reverse biased during normal operations (706).

For the purposes of the flowchart, the steps are illustrated in a sequence. In some embodiments, some of the steps may be performed in a different sequence than that shown in the flowchart.

The technology described herein is applicable for integrated circuit memory based on memory cells including phase change memory elements in series with ovonic threshold switches, which can require a forming operation. Because high voltage is required for forming operations on devices like this, standard CMOS processes cannot be relied upon unless modified to support high voltage devices. As described herein, the technology is provided enabling the application of a forming operation compatible with standard CMOS processes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a set of pads configured for connection to external circuits, including a forming voltage pad;
a memory array including a plurality of memory cells, and a plurality of access lines connected in current flow communication with memory cells in the array;
a forming voltage rail coupled to the forming voltage pad; and
a diode disposed in current flow communication with the forming voltage rail and an access line in the plurality of access lines, the diode configured to be forward biased during application of a forming voltage to the forming voltage pad to induce a forming current in memory cells in the plurality of memory cells, and to be reverse biased during application of a reference voltage to the forming voltage pad during utilization of the memory array for memory operations.

2. The integrated circuit of claim 1, wherein the plurality of memory cells includes a plurality of banks of memory cells, each bank including a set of N access lines, configured as one of bit lines and word lines; and including:
a set of forming voltage rails, including said first mentioned forming voltage rail, the set of forming voltage rails having N members;
a plurality of diodes, including said first mentioned diode, the plurality of diodes including a plurality of sets of diodes having N members, the sets of diodes in the plurality of sets of diodes coupled to corresponding banks in the plurality of banks; the N members in each of the sets of diodes being connected in current flow communication with corresponding ones of the N members of the set of forming voltage rails and with corresponding ones of the N access lines in its corresponding bank; and
a set of switches having N members, switches in the set having a first terminal in current flow communication with the forming voltage pad and a second terminal in current flow communication with a corresponding forming voltage rail in the set of forming voltage rails, the switches configured to electrically connect and disconnect the forming voltage pad and their corresponding forming voltage rails in response to a control sequence.

3. The integrated circuit of claim 1, comprising:
peripheral circuits coupled to pads in a signal subset of the set of pads, and to the plurality of access lines, the peripheral circuits including a control circuit configured to execute memory operations;
a power rail coupled to at least one pad in a power supply subset of the set of pads by which power is distributed to one or both of the memory array and the peripheral circuits for the memory operations; and
a set of one or more diodes including said first mentioned diode, each diode in the set having a first and a second terminal, the first terminal, or terminals, of the one or more diodes connected to the forming voltage rail, and the second terminal, or terminals, of the one or more diodes connected in current flow communication to access lines in the plurality of access lines.

4. The integrated circuit of claim 3, wherein the control circuit is configured to execute a forming operation in which current through the forming voltage rail is applied to the memory cells via the plurality of access lines, and to execute memory operations in which current through the power rail is applied to memory cells via the plurality of access lines.

5. The integrated circuit of claim 3, wherein, in a forming operation, the control circuit is configured to forward bias the set of one or more diodes when a forming voltage is applied to the forming voltage pad and, in the memory operation, the control circuit is configured to reverse bias the set of one or more diodes when a reference voltage is applied to the forming voltage pad.

6. The integrated circuit of claim 3, wherein the memory array includes a plurality of second access lines coupled in current flow communication with the memory cells, and in a forming operation, the control circuit applies a bias voltage to the plurality of second access lines to forward bias the set of one or more diodes.

7. The integrated circuit of claim 3, wherein the set of one or more diodes includes a plurality of diodes connected to respective ones of the plurality of access lines.

8. The integrated circuit of claim 3, wherein the peripheral circuits include sense amplifiers, and the plurality of access lines comprises bit lines coupled to the sense amplifiers.

9. The integrated circuit of claim 3, wherein the memory array includes a plurality of second access lines coupled in current flow communication with the memory cells, wherein the peripheral circuits include sense amplifiers, and the plurality of second access lines comprise bit lines coupled to the sense amplifiers.

10. The integrated circuit of claim 1, wherein memory cells in the array of memory cells comprise phase change memory cells.

11. The integrated circuit of claim 10, wherein the phase change memory cells comprise phase change memory elements in series with ovonic threshold switch elements.

12. The integrated circuit of claim 1, including:
a second forming voltage rail coupled to a second forming voltage pad of the set of pads; and
a second set of one or more diodes, each diode in the second set having a first and a second terminal, the first terminal, or terminals, of the one or more diodes in the second set connected to the second forming voltage rail circuit, and the second terminal, or terminals, of the one or more diodes in the second set connected in current flow communication to access lines in the plurality of access lines.

13. The integrated circuit of claim 3, wherein the peripheral circuits comprise CMOS transistors, and all of the CMOS transistors in the peripheral circuits have a breakdown voltage that is less than a forming voltage Vf applied to the forming voltage pad.

14. An integrated circuit, comprising:
a set of pads configured for connection to external circuits;
a memory array including a plurality of banks of memory cells, each bank including a set of N access lines, configured as one of bit lines and word lines, and connected in current flow communication to memory cells in the bank;
peripheral circuits coupled to pads in a signal subset of the set of pads, and to the plurality of sets of N access lines, the peripheral circuits including a control circuit configured to execute memory operations;
a power rail coupled to at least one pad in a power supply subset of the set of pads by which power is distributed to the memory array and the peripheral circuits for the memory operations;
a set of forming voltage rails having N members; and
a plurality of sets of diodes, each set of diodes in the plurality of sets of diodes coupled to a corresponding bank in the plurality of banks, each set of diodes in the plurality of sets of diodes having N members, the N members in each of the sets of diodes being connected in current flow communication with corresponding ones of the N members of the set of forming voltage rails and with corresponding ones of the N access lines in its corresponding bank; and
a set of switches having N members, switches in the set having a first terminal in current flow communication with a forming voltage pad in the set of pads, and a second terminal in current flow communication with a corresponding forming voltage rail in the set of forming voltage rails, the switches configured to electrically connect and disconnect the forming voltage pad and their corresponding forming voltage rails in response to a control sequence.

15. The integrated circuit of claim 14, wherein the control circuit is configured to execute a forming operation including the control sequence, and in which the control sequence includes connecting in sequence each of the forming voltage rails in the set of forming voltage rails to memory cells via the corresponding ones of the N access lines in the set of access lines in each of the banks.

16. The integrated circuit of claim 14, wherein the memory cells comprise phase change memory elements in series with ovonic threshold switch elements.

17. The integrated circuit of claim 14, wherein the peripheral circuits comprise CMOS transistors, and all of the CMOS transistors in the peripheral circuits have a breakdown voltage that is less than a forming voltage Vf applied to the forming voltage pad.

18. A method, comprising:
providing an integrated circuit, the integrated circuit having a memory array including a plurality of memory cells, a plurality of access lines connected in current flow communication to memory cells in the array, and a forming voltage pad in current flow communication via diodes with access lines in the plurality of access lines; and
applying forming pulses to the forming voltage pad using an external power source, the forming pulses having a voltage magnitude to forward bias the diode; and
controlling switches on the integrated circuit according to a control sequence including connecting forming voltage rails connected to the forming voltage pad in sequence to memory cells via the corresponding ones of the plurality of access lines.

19. The method of claim 18, wherein the integrated circuit includes:
a set of pads configured for connection to external circuits, the set of pads including the forming voltage pad;
peripheral circuits coupled to pads in a signal subset of the set of pads, and to the plurality of access lines, the peripheral circuits including a control circuit configured to execute memory operations;
a power rail coupled to at least one pad in a power supply subset of the set of pads by which power is distributed to the memory array and the peripheral circuits for the memory operations;
a forming voltage rail switchably coupled to the forming voltage pad; and
a set of one or more diodes including said first mentioned diode, each diode in the set having a first and a second terminal, the first terminal, or first terminals, of the one or more diodes connected to the forming voltage rail, and the second terminal, or second terminals, of the one or more diodes connected in current flow communication to access lines in the plurality of access lines.

20. The method of claim 18, including connecting the integrated circuit to a forming pulse system including a power supply prior to mounting the integrated circuit as a component of an operational device, and using the power supply of the forming pulse system as an external power supply applying the forming pulse to the forming voltage pad.

21. The method of claim 18, including mounting the integrated circuit as a component of an operational device, and connecting the forming pulse pad to a constant voltage reference whereby the diode is reverse biased during operation of the device.

* * * * *